United States Patent
Mann et al.

(10) Patent No.: US 6,358,380 B1
(45) Date of Patent: Mar. 19, 2002

(54) PRODUCTION OF BINARY SHAPE-MEMORY ALLOY FILMS BY SPUTTERING USING A HOT PRESSED TARGET

(75) Inventors: Gamdur Singh Mann, Grand Blanc; Carlos Augusto Valdes, Flint; Terry Jack Gold, Davison; Jinping Zhang, Grand Blanc; Fenglian Chang, Grand Blanc; Gregory Keller Rasmussen, Grand Blanc, all of MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/401,085

(22) Filed: Sep. 22, 1999

(51) Int. Cl.$^7$ ............................................... C23C 14/34
(52) U.S. Cl. ............................. 204/192.2; 204/298.13
(58) Field of Search ..................... 204/192.12, 192.15, 204/192.2, 298.13

(56) References Cited

U.S. PATENT DOCUMENTS

| | | | |
|---|---|---|---|
| 5,061,914 A | 10/1991 | Busch et al. ................. | 337/140 |
| 5,108,523 A | 4/1992 | Peterseim et al. .......... | 148/402 |
| 5,114,504 A | 5/1992 | AbuJudom, II et al. .... | 148/402 |
| 6,165,413 A | * 12/2000 | Lo et al. ........................ | 419/49 |

OTHER PUBLICATIONS

K. Nomura, S. Miyazaki and A. Ishida, "Effect of Plastic Strain on Shape Memory Characteristics in Sputter–Deposited Ti–Ni Thin Films", Journal De Physique IV, Colloque C8, supplement au Journal de Physique III, vol. 5, Dec. 1995, pp. C8–695 to C8–700.

A. Ishida, M. Sato, A. Takei, K. Nomura, and S. Miyazaki, "Effect of Aging on Shape Memory Behavior of Ti–51.3 At. Pct Ni Thin Films", Metallurgical and materials Transactions A, vol. 27A, Dec. 1996, pp. 3753–3759.

S. Miyazaki and K. Nomura, "Development of Perfect Shape Memory Effect in Sputter–Deposited Ti–Ni Thin Films", Proc. IEEE Micro Electro Mechanical Systems (MEMS–94), Oiso, Japan, (1994), pp. 176–181.

Akira Ishida, Morio Sato, Atsushi Takei, and Shuichi Miyazaki, "Effect of Heat Treatment on Shape Memory Behavior of Ti–rich Ti–Ni Thin Films", Materials Transactions, JIM, vol. 36, No. 11 (1995), pp. 1349–1355.

S.A. Mathews, Manfred Wuttig, and Quanmin Su, "The Effect of Substrate Constraint on the Martensitic Transformation of Ni–Ti Thin Films", Metallurgical and Materials Transactions A, Vol. 27A, Sep. 1996, pp. 2859 to 2861.

X. D. Han, W. H. Zou, R. Wang, Z. Zhang, D. Z. Yang, and K. H. Wu, "The Martensite Structure and Aging Precipitates of a TiNiHf High Temperature Shape Memory Alloy", Journal De Physique IV, Colloque C8, supplement au Journal de Physique III, vol. 5, Dec. 1995, pp. C8–753 to C8–758.

D. S. Grummon and T. J. Pence, "Thermotractive Titanium–Nickel Thin Films For Microelectromechanical Systems And Active Composites", Mat. Res. Soc. Symp. Proc. vol. 459 ©1997 Materials Research Society, pp. 331 to 343.

D. S. Grummon, Li Hou, Z. Zhao, and T.J. Pence, "Progress on Sputter–Deposited Thermotractive Titanium–Nickel Films", Journal De Physique IV, Colloque C8, supplement au Journal de Physique III, vol. 5, Dec. 1995, pp. C8–665 to C8–670.

A.D. Johnson, V. V. Martynov, and R. S. Minners, "Sputter Deposition of High Transition Temperature Ti–Ni–Hf Alloy Thin Films", Journal De Physique IV, Colloque C8, supplement au Journal de Physique III, vol. 5, Dec. 1995, pp. C8–783 to C8–801.

* cited by examiner

*Primary Examiner*—Nam Nguyen
*Assistant Examiner*—Steven H. VerSteeg
(74) *Attorney, Agent, or Firm*—Patrick M. Griffin

(57) ABSTRACT

A method for producing thin film deposits of binary shape-memory alloys using an ion sputtering deposition process comprising using a hot pressed metal powder composition target.

10 Claims, 3 Drawing Sheets

PRODUCTION OF BINARY SHAPE-MEMORY ALLOY FILMS BY SPUTTERING USING A HOT PRESSED TARGET

TECHNICAL FIELD

This invention relates to a method of producing binary shape-memory alloy films by sputtering process techniques. In particular it relates to a method of producing shape-memory nickel titanium alloy films using hot pressed metal targets in the sputtering process.

BACKGROUND OF THE INVENTION

Various metallic materials capable of exhibiting shape-memory characteristics are well known in the art. These shape-memory capabilities occur as the result of the metallic alloy undergoing a reversible crystalline phase transformation from one crystalline state to another crystalline state with a change in temperature and/or external stress. In particular, it was discovered that alloys of nickel and titanium exhibited these remarkable properties of being able to undergo energetic crystalline phase changes at ambient temperatures, thus giving them a shape-memory. These alloys, if plastically deformed while cool, will revert, exerting considerable force, to their original, undeformed shape when warmed. These energetic phase transformation properties render articles made from these alloys highly useful in a variety of applications. An article made of an alloy having a shape memory can be deformed at a low temperature from its original configuration, but the article "remembers" its original shape, and returns to that shape when heated.

For example, in nickel-titanium alloys possessing shape-memory characteristics, the alloy undergoes a reversible transformation from an austenitic state to a martensitic state with a change in temperature. This transformation is often referred to as a thermoelastic martensitic transformation. The reversible transformation of the NiTi alloy between the austenite to the martensite phases occurs over two different temperature ranges which are characteristic of the specific alloy. As the alloy cools, it reaches a temperature ($M_s$) at which the martensite phase starts to form, and finishes the transformation at a still lower temperature ($M_f$). Upon reheating, it reaches a temperature ($A_s$) at which austenite begins to reform and then a temperature ($A_f$) at which the change back to austenite is complete. In the martensitic state, the alloy can be easily deformed. When sufficient heat is applied to the deformed alloy, it reverts back to the austenitic state, and returns to its original configuration.

Shape-memory materials previously have been produced in bulk form, in the shape of wires, rods, and plates, for utilities such as pipe couplings, electrical connectors, switches, and actuators, and the like. Actuators previously have been developed, incorporating shape-memory alloys or materials, which operate on the principal of deforming the shape-memory alloy while it is below its phase transformation temperature range and then heating it to above its transformation temperature range to recover all or part of the deformation, and, in the process of doing so, create moments of one or more mechanical elements. These actuators utilize one or more shape-memory elements produced in bulk form, and, therefore are limited in size and usefulness.

The unique properties of shape-memory alloys further have been adapted to applications such as micro-actuators by means of thin film technology. Micro-actuators are desirable for such utilities as opening and closing valves, activating switches, and generally providing motion for micro-mechanical devices. It is reported that the advantageous performance of micro-actuators is attributed to the fact that the shape-memory effect of the stress and strain can produce substantial work per unit of volume. For example, the work output of nickel titanium shape-memory alloy is of the order of 1 joule per gram per cycle. A shape-memory film micro-actuator measuring one square millimeter and ten microns thick is estimated to exert about 64 microjoules of work per cycle.

The most well known and most readily available shape-memory alloy is an alloy of nickel and titanium. With a temperature change of as little as about 10° C., this alloy can exert a force of as much as 415 MPa when applied against a resistance to changing its shape from its deformation state. However, there exists a challenge to develop low cost, reliable processes for producing microns-thick, thin films of these shape-memory alloys.

SUMMARY OF THE INVENTION

Now an improved process for fabricating shape-memory alloy thin films using sputtering techniques has been developed.

According to the present invention, there is provided a method for producing a thin film deposit of a shape-memory alloy film wherein a hot pressed metal target is employed in the sputtering process.

While the use of hot pressed targets in a sputtering process for producing thin films is a previously practiced technique, the use of such target materials in producing shape-memory alloy films has not been recognized as a viable approach. The inherent porosity of a pressed powder composition dictated against the use of hot pressed targets for thin film sputtering of shape-memory alloys, because of the potential for trapped oxygen. Oxygen contamination was found to have adverse effects on shape-memory properties of NiTi alloys, such as by suppressing martensite transformation and degrading the mechanical properties of the alloys.

Phase transition temperatures and shape-memory properties of NiTi shape-memory alloys are very sensitive to the composition. It was found that 1 at % of redundant nickel could decrease Ms temperature by 100° C., and the redundant titanium could substantially degrade the mechanical properties of the material. To ensure consistent transition temperatures and good shape-memory effect ("SME") properties, composition control is the key. In NiTi thin film fabrication processing by sputtering, the first source of composition variation of thin film is from target. Therefore, target composition has to be closely controlled.

To minimize oxygen contamination, typically, sputtering targets for shape-memory alloy films are fabricated using alloy process techniques involving numerous steps including melting, remelting, solidification, and even long-time homogenization treatment. Because very high temperature has to be used, these procedures often result in the preferential loss of one or more elements to the others, and the compositional control becomes very difficult. Along with high cost and long processing time, the difficulty in compositional control makes this target-making process very impractical, especially when making large size targets.

According to the present process, a homogenous target for sputtering deposition is accomplished by using hot pressing powder metallurgy techniques. In addition to quicker and easier fabrication, and significantly facilitated compositional control, it unexpectedly has been found that binary shape-memory alloy thin films produced by sputtering using such hot pressed targets exhibit excellent mechanical properties and shape-memory effect, as well as widely ranged phase transition temperatures.

DESCRIPTION OF AN EMBODIMENT OF THE INVENTION

In a sputtering process, as in the present invention, the sputtering deposition generally takes place in a chamber, such as a Perkin Elmer chamber. An initial base vacuum pressure first is established; this pressure ranges from about $5\times10^{-6}$ torr or lower. Preferably, the base vacuum pressure ranges from about $1\times10^{-6}$ to about $1\times10^{-7}$ torr.

During the ion sputtering process, ionization process gas should be maintained at a pressure ranging from about 0.1 to about 10 mTorr. Preferably, process gas pressure ranges from about 0.5 mTorr to about 5 mTorr. The ionizing process gas may be any typical sputtering process gas such as argon, krypton, or xenon. The preferred process gas is argon. Power applied during sputtering should range between about 50 watts to about 10 kilowatts; preferably the power applied ranges from about 300 watts to about 3000 watts.

Thin films having a wide range of compositions and thicknesses can be deposited using the present process. Preferred compositions are titanium nickel compositions ranging between $Ni_{55}Ti_{45}$ and $Ni_{45}Ti_{55}$; most preferred are alloy compositions ranging between $Ni_{51}Ti_{49}$ and $Ni_{49}Ti_{51}$. Film thicknesses ranging from about 1 micron to about 10 microns are preferred; particularly preferred are deposited film thicknesses ranging from about 3.5 microns to about 4.5 microns.

Pursuant to the present process, hot pressed metal targets having an elemental composition with approximately two percent more Ti than the desired alloy film to be deposited are utilized due to the fact that Ti loses preferentially in a sputter deposition process. These targets can be fabricated by first mixing nickel and titanium powders together in the desired proportions. After thoroughly blending the powder mixture and degassing, the blend is dispensed into a target mold in vacuum conditions, and heated to a high temperature ranging from about 1 100° C. to 1300° C., preferably about 1250° C., and pressure is applied generally ranging from about 0 to about 200 MPa. It is preferred to process the targets at a pressure of about 100 MPa in order to minimize the porosity of the target composition.

The following examples are provided to further describe the invention. The examples are intended to be illustrative and are not to be construed as limiting the scope of the invention.

EXAMPLE 1

Figure 1:
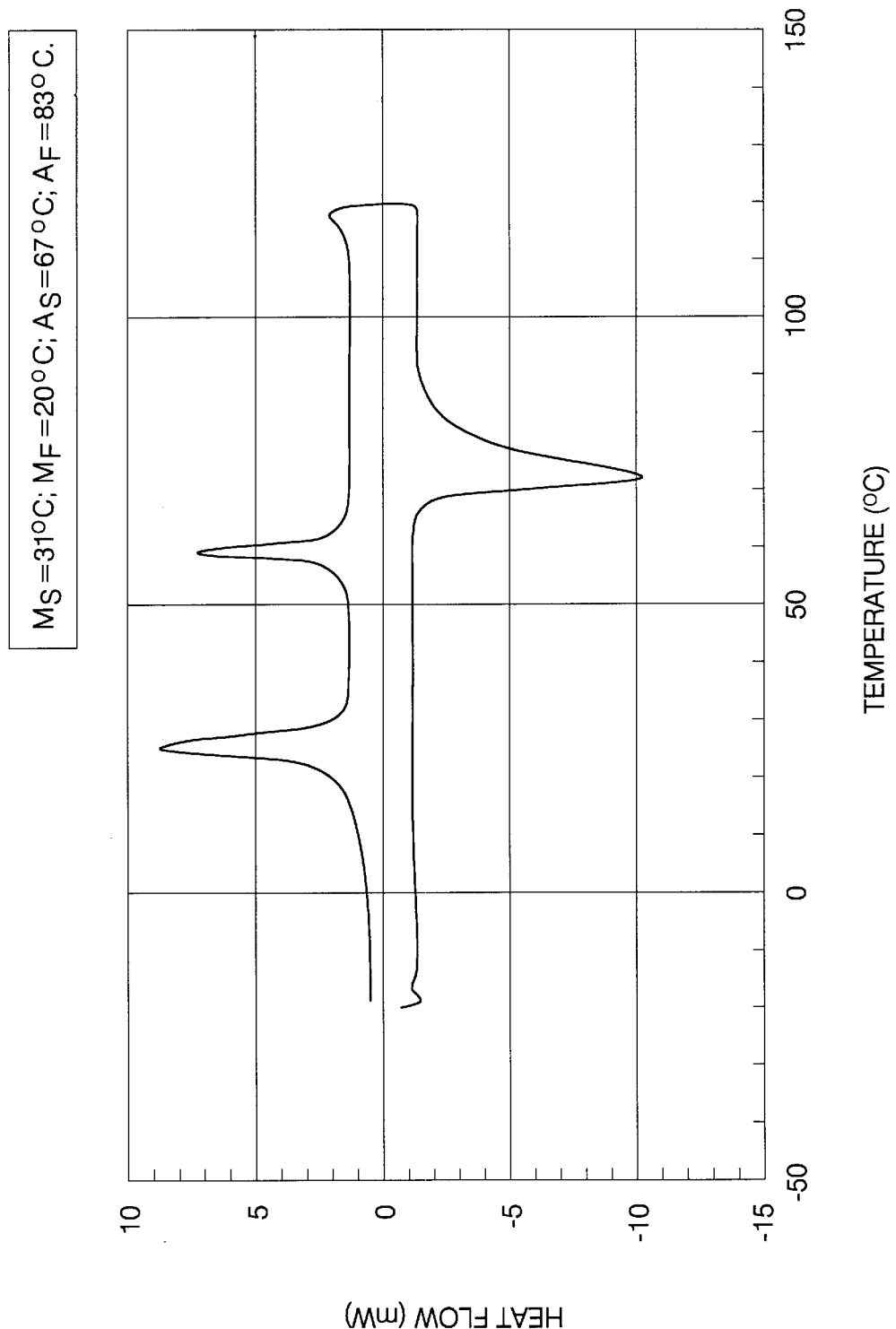
FIG. 1 is a graph depicting a plot of transformation temperatures of delaminated film, deposited pursuant to the present invention, as measured by Differential Scanning Calorimetry (DSC).
Figure 2:
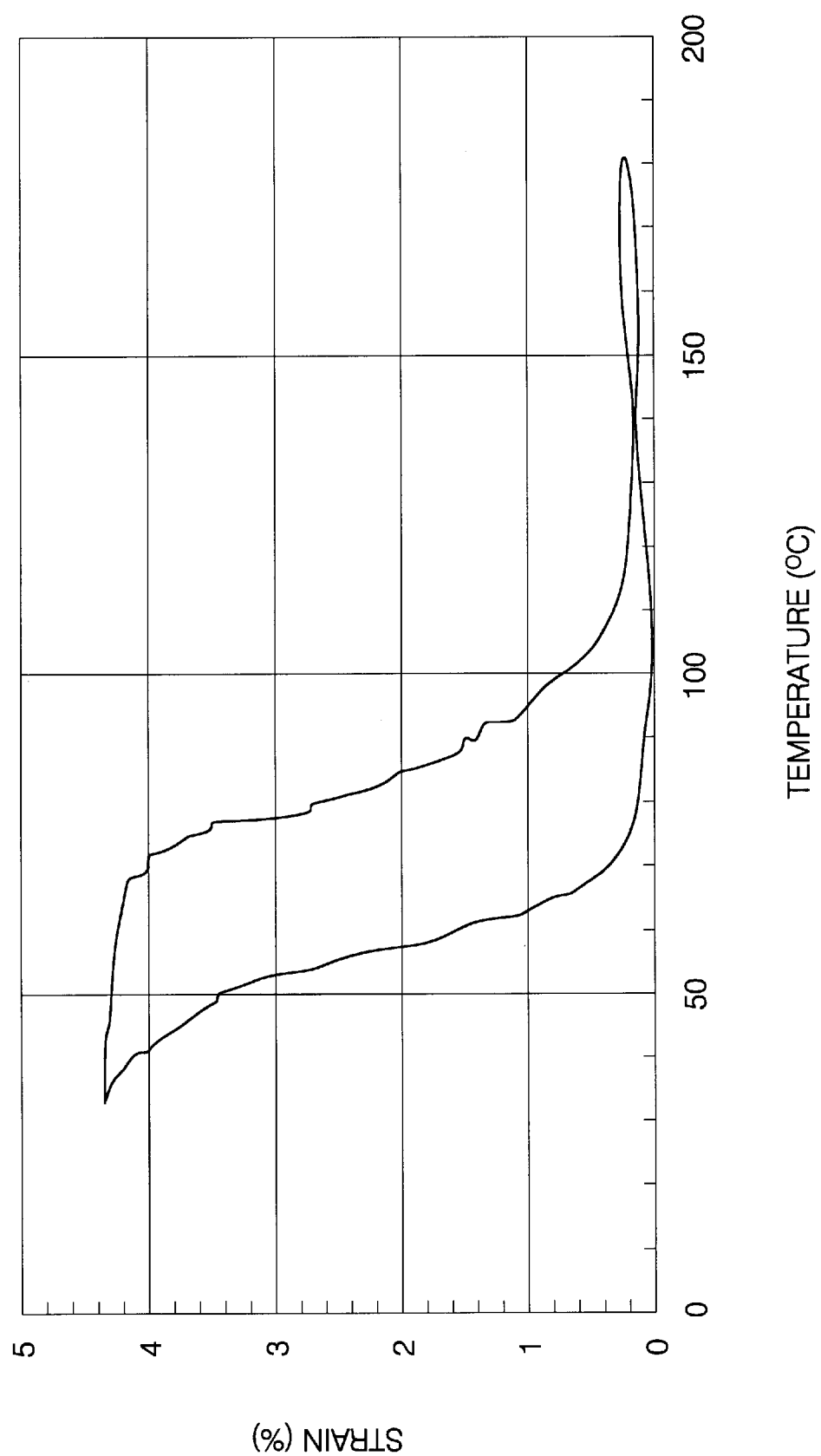
FIG. 2 is a graph depicting the strain-temperature curve of a hot pressed target-deposited binary film, pursuant to the present invention, during a thermal cycle while the film was under constant load.

4.5 μm thick NiTi binary films were sputter deposited on 5"-diameter oxide passivated Si substrates from an 8" $Ni_{47}Ti_{53}$ hot pressed target. Deposition parameters included: base pressure $5\times10^{-7}$ torr before deposition, working gas Ar pressure 1.5 mTorr during deposition, target-to-substrate distance 3.2 inches, deposition power 1 kW, substrate temperature 400–420° C. and deposition time 53 minutes. Chemical composition of the deposit was measured to be $Ni_{49}Ti_{5}1$ around the central area of the wafer by x-ray Energy Dispersive Spectrum (EDS) equipped on a Scanning Electron Microscope (SEM). The as-deposited film had shape-memory effect without any further thermal treatment. The transformation temperatures of delaminated film were measured by Differential Scanning Calorimetry (DSC) and the results are shown in FIG. 1. Shape-memory properties were measured with 60×3 mm strips which were thermally cycled under constant stresses. During thermal cycles between room temperature to 200° C., the length change of the strip was measured in a custom-built apparatus and the strain was calculated accordingly. Table A shows the experimental results of the hot-deposited film at various stresses. It indicates that maximum fully recoverable stress was over 300 MPa, and maximum fully recoverable strain was over 4%, the maximum sustainable stress for thermal cycling was over 400 MPa. FIG. 2 shows a typical strain-temperature curve of the hot-deposited binary film during a thermal cycle while the film was constantly loaded.

TABLE A

SME of a Hot Pressed Target-Deposited $Ni_{49}Ti_{51}$ Film under Different Stresses

| Stress (MPa) | 100 | 150 | 200 | 250 | 300 | 350 | 400 |
|---|---|---|---|---|---|---|---|
| Strain Resulted by Cooling (%) | 2.6 | 3.1 | 3.5 | 3.9 | 4.3 | 4.5 | 4.7 |
| Strain Recovered by Heating (%) | 2.6 | 3.1 | 3.5 | 3.9 | 4.3 | 4.2 | 4.2 |

EXAMPLE 2

Figure 3:
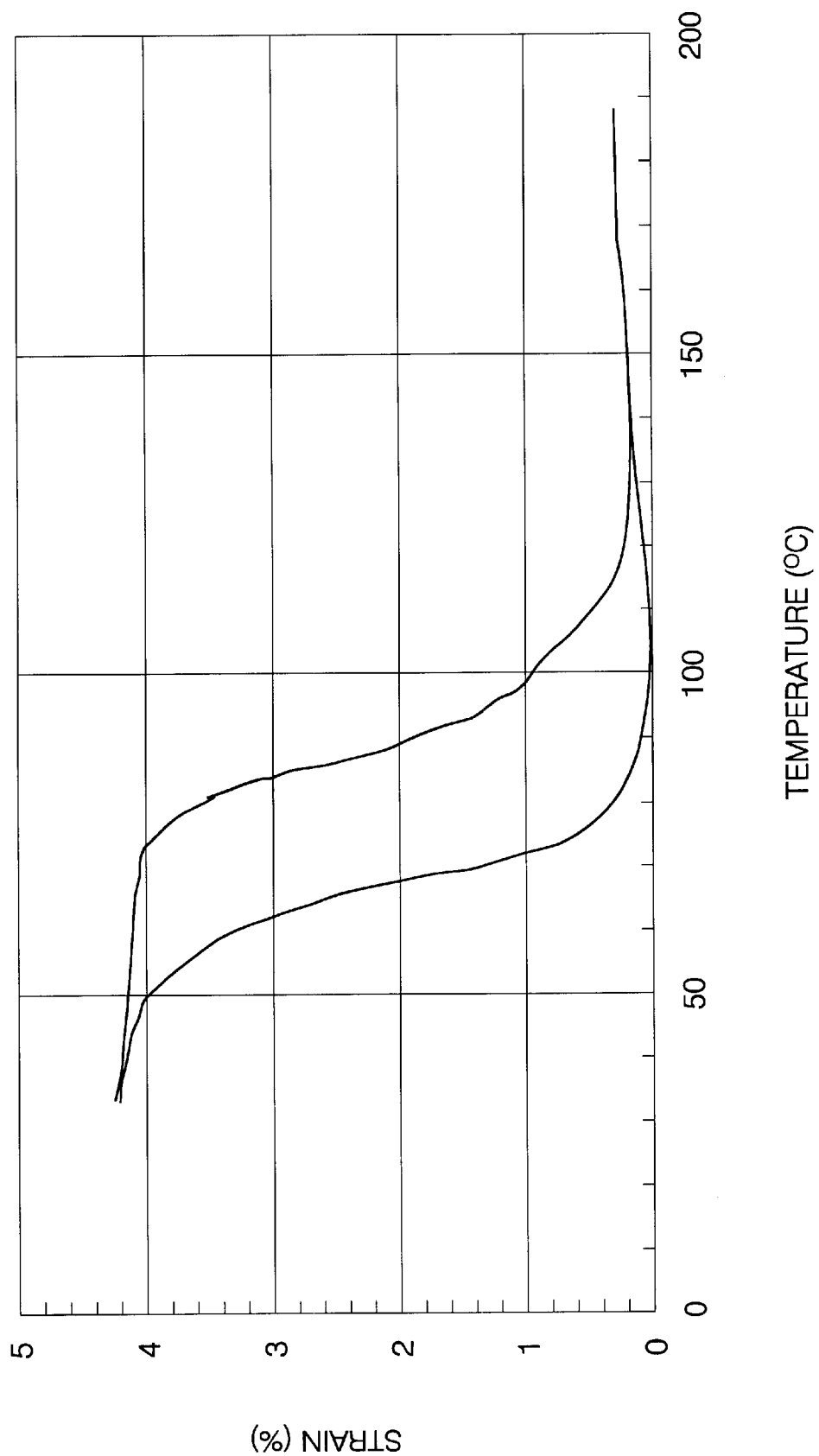
FIG. 3 is a graph depicting the strain-temperature curve of annealed shape-memory alloy films, pursuant to the present invention, during thermal cycles, while the film was under a constant load.

Another thin film deposition process performed was a two-step procedure, i.e., depositing amorphous material at a substantially lower substrate temperature and then annealing it at high temperature to acquire SME. This procedure was more commonly practiced in SMA thin film deposition. In this process, the target was also a $Ni_{47}Ti_{53}$ hot pressed target. Deposition parameters were: base pressure $5\times10^{-7}$ torr before deposition, working gas Ar pressure 1.5 mTorr during deposition, target-to-substrate distance 3.7 inches, deposition power 1 kW, substrate temperature 200~250° C. and deposition time 55 minutes. Chemical composition of the deposit was also close to $Ni_{49}Ti_{51}$. The as-deposited material then was annealed at 550° C. for 30 minutes in a chamber with vacuum better than $1\times10^{-5}$ torr during annealing. Annealing process could be either before delaminating or after delaminating. Likewise, shape-memory properties were measured from 60×3 mm strips while they underwent thermal cycling under constant stresses. Table B shows the experimental results of the SMA films made by the two-step procedure at different stresses. It indicates the maximum recoverable stress was over 300 MPa, maximum recoverable strain was over 4%, and the maximum sustainable stress for thermal cycling was over 400 MPa. FIG. 3 shows the typical strain-temperature curve of annealed SMA thin films while the film was constantly loaded.

TABLE B

| SME of an Annealed Ni$_{49}$Ti$_{51}$ Film under Different Stresses | | | | | | | |
|---|---|---|---|---|---|---|---|
| Stress (MPa) | 100 | 150 | 200 | 250 | 300 | 350 | 400 |
| Strain Resulted by Cooling (%) | 3.0 | 3.3 | 3.6 | 3.8 | 4.1 | 4.3 | 4.4 |
| Strain Recovered by Heating (%) | 3.0 | 3.3 | 3.6 | 3.8 | 4.1 | 3.6 | 3.6 |

From the two examples above, it is demonstrated that the NiTi binary thin film produced from the hot pressed target possessed shape-memory effect when high substrate temperature was employed during deposition, or could acquire good SME after a high temperature annealing when low substrate temperature was employed during deposition. The material properties listed here compare favorably with published data of NiTi binary thin film deposited using alloy target. Using a hot-pressed target to deposit NiTi binary thin film is advantageous over using alloy target, considering the cost, timing, flexibility, and reliability of the target-making process.

Various other embodiments or other modifications of the disclosed embodiments will be apparent to those skilled in the art upon reference to this description, or may be made without departing from the spirit and scope of the invention defined in the appended claims.

What is claimed is:

1. A method for producing a thin film deposit of a binary shape-memory alloy using an ion sputtering deposition process comprising:
    conducting the sputtering deposition using a homogeneous hot pressed metal powder target, comprising a mixture of elemental nickel and titanium blended powders.

2. The method of claim 1 wherein the shape-memory alloy comprises a nickel titanium alloy.

3. The method of claim 2 wherein the hot pressed target is fabricated from nickel and titanium metal powders to produce an alloy having an atomic ratio ranging between Ni$_{45}$Ti$_{55}$ and Ni$_{55}$Ti$_{45}$.

4. The method of claim 3 wherein the hot pressed target is fabricated from nickel and titanium metal powders to produce an alloy having an atomic ratio ranging between Ni$_{49}$Ti$_{51}$ and Ni$_{51}$ and Ni$_{51}$Ti$_{49}$.

5. The method of claim 1 wherein a process gas comprising argon is used during the sputtering deposition process.

6. The method of claim 5 wherein the argon process gas has a pressure ranging from about 0.5 mTorr to about 5 mTorr.

7. The method of claim 1 wherein the sputtering process is conducted at an applied power of about 50 watts to about 10000 watts.

8. The method of claim 7 wherein the sputtering process is conducted at an applied power of about 300 watts to about 3000 watts.

9. The method of claim 1 wherein the hot pressed target is fabricated by a process comprising mixing nickel and titanium metal powders, degassing the mixture, molding the mixture to the desired shape, heating the molded shapes to a temperature ranging from about 1100° C. to about 1300° C., while applying a pressure ranging from about 0 to about 200 MPa.

10. A method of producing a thin film deposit of a binary shape-memory alloy using an ion sputtering deposition process comprising:
    evacuating a deposition chamber to a pressure ranging from about $1 \times 10^{-6}$ to about $1 \times 10^{-7}$ torr;
    maintaining an argon gas during deposition at a pressure ranging from about 0.5 mTorr to about 5 mTorr;
    applying a sputtering power of about 300 watts to about 3000 watts; and
    using a homogenous hot pressed sputtering target comprising a blended metal powder mixture comprising elemental nickel and titanium powders.

* * * * *